(12) United States Patent
Lim

(10) Patent No.: US 11,869,837 B2
(45) Date of Patent: Jan. 9, 2024

(54) SEMICONDUCTOR DEVICE PACKAGING EXTENDABLE LEAD AND METHOD THEREFOR

(71) Applicant: NXP B.V., Eindhoven (NL)

(72) Inventor: Mei Yeut Lim, Kaohsiung (TW)

(73) Assignee: NXP B.V., Eindhoven (NL)

( * ) Notice: Subject to any disclaimer, the term of this patent is extended or adjusted under 35 U.S.C. 154(b) by 105 days.

(21) Appl. No.: 17/382,835

(22) Filed: Jul. 22, 2021

(65) Prior Publication Data

US 2023/0027248 A1 Jan. 26, 2023

(51) Int. Cl.
*H01L 23/00* (2006.01)
*H01L 23/498* (2006.01)
*H01L 21/48* (2006.01)
*H01L 25/065* (2023.01)

(52) U.S. Cl.
CPC .... *H01L 23/49861* (2013.01); *H01L 21/4839* (2013.01); *H01L 23/49816* (2013.01); *H01L 23/49838* (2013.01); *H01L 24/32* (2013.01); *H01L 24/48* (2013.01); *H01L 24/85* (2013.01); *H01L 25/0657* (2013.01); *H01L 2224/32145* (2013.01); *H01L 2224/32225* (2013.01); *H01L 2224/32245* (2013.01); *H01L 2224/4845* (2013.01); *H01L 2224/48175* (2013.01); *H01L 2224/48455* (2013.01); *H01L 2224/48463* (2013.01); *H01L 2224/85439* (2013.01);
(Continued)

(58) Field of Classification Search
CPC ........... H01L 23/49861; H01L 21/4839; H01L 23/49816; H01L 23/49838; H01L 24/32; H01L 24/48; H01L 24/85; H01L 25/0657; H01L 2224/32145; H01L 2224/32225; H01L 2224/32245; H01L 2224/48175; H01L 2224/4845; H01L 2224/48455; H01L 2224/48463; H01L 2224/85439; H01L 2224/85444; H01L 2224/85455; H01L 2225/06524; H01L 23/49503; H01L 24/45; H01L 2224/05554; H01L 2224/45139; H01L 2224/45144; H01L 2224/45147; H01L 2224/48091; H01L 2224/48465; H01L 2224/49113; H01L 2224/4917; H01L 2224/73265; H01L 2224/8592; H01L 2224/92247; H01L 2924/15311; H01L 2924/181; H01L 23/49531

See application file for complete search history.

(56) References Cited

U.S. PATENT DOCUMENTS 6,559,526 B2 5/2003 Lee et al.
7,245,007 B1 * 7/2007 Foster ............... H01L 23/49527
257/E23.047
(Continued)

*Primary Examiner* — Elias Ullah
(74) *Attorney, Agent, or Firm* — Robert J. Amedeo

(57) ABSTRACT

A method of manufacturing a semiconductor device is provided. The method includes attaching a first end of a first bond wire to a first conductive lead and a second end of the first bond wire to a first bond pad of a first semiconductor die. A conductive lead extender is affixed to the first conductive lead by way of a conductive adhesive, the lead extender overlapping the first end of the first bond wire. A first end of a second bond wire is attached to the lead extender, the first end of the second bond wire conductively connected to the first end of the first bond wire.

15 Claims, 8 Drawing Sheets

(52) U.S. Cl.
CPC ............... *H01L 2224/85444* (2013.01); *H01L 2224/85455* (2013.01); *H01L 2225/06524* (2013.01)

(56) References Cited

U.S. PATENT DOCUMENTS 7,816,771 B2    10/2010    Shen et al.
7,872,335 B2    1/2011    Khan et al.

* cited by examiner

SEMICONDUCTOR DEVICE PACKAGING EXTENDABLE LEAD AND METHOD THEREFOR

BACKGROUND

Field

This disclosure relates generally to semiconductor devices, and more specifically, to semiconductor device packaging extendable lead and method of forming the same.

Related Art

Semiconductor devices are often found in a large spectrum of electronic products—from sewing machines to washing machines, from automobiles to cellular telephones, and so on. Many of these semiconductor devices are produced in high volumes to drive costs down. Factors such as manufacturing processes may be optimized for product costs but could adversely affect product performance and reliability. As technology progresses, semiconductor manufacturing continues to seek ways to improve performance and reliability in these semiconductor devices while keeping product costs in focus.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device having a conductive lead extender. The semiconductor device includes one or more semiconductor die mounted on a package leadframe or substrate having a plurality of conductive leads. The lead extender is affixed to one or more (neighboring) leads of the plurality of leads. The conductive lead extender is affixed by way of a conductive adhesive and configured for extending the wire bonding area associated with the particular one or more leads without increasing package size or dimensions. The lead extender is especially useful on power leads requiring multiple connections to the one or more semiconductor die, for example.

Figure 1:
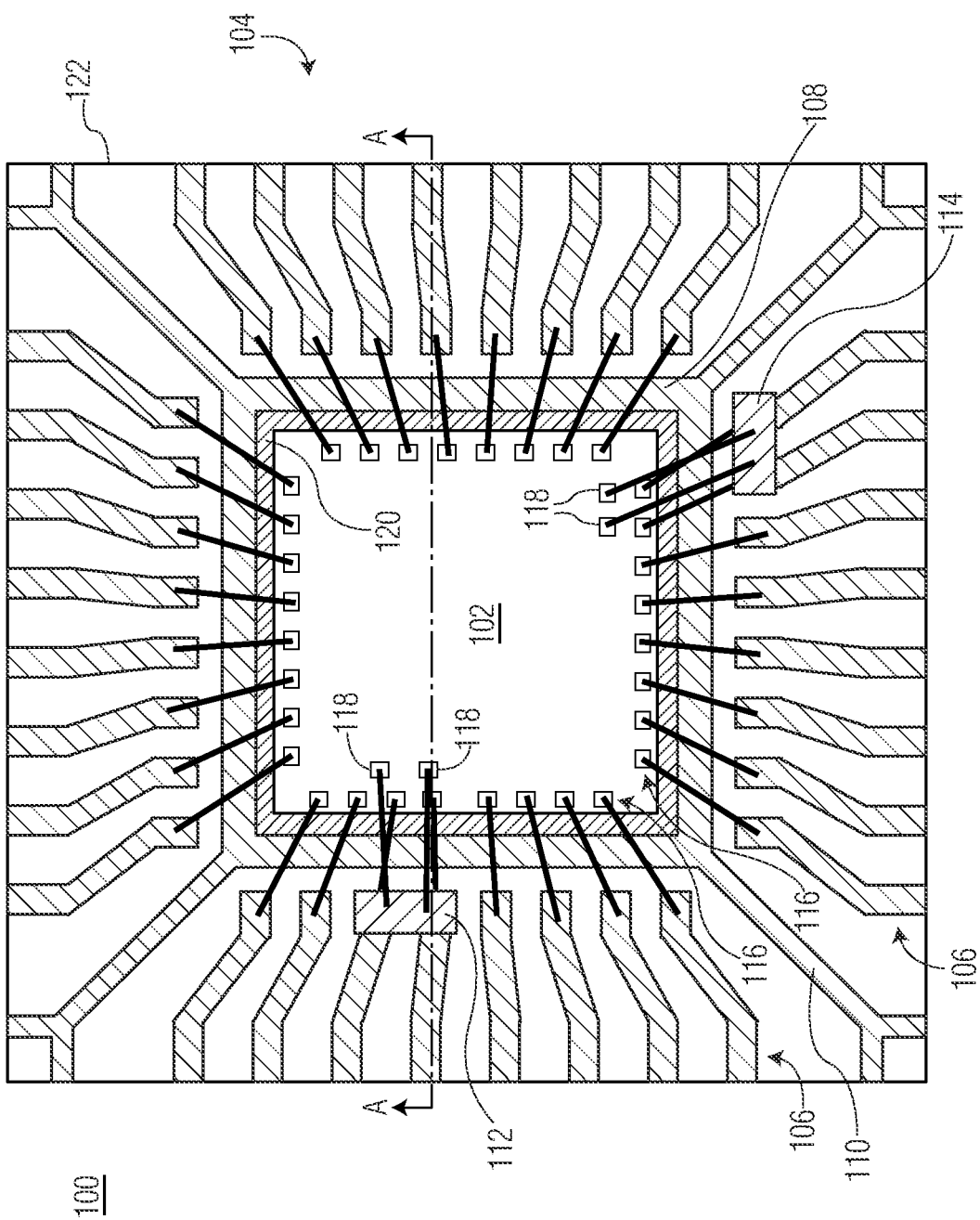
FIG. 1 illustrates, in a simplified plan view, an example semiconductor device having lead extenders at a stage of manufacture in accordance with an embodiment.

FIG. 1 illustrates, in a simplified plan view, an example semiconductor device 100 having lead extenders at a stage of manufacture in accordance with an embodiment. At this stage, the semiconductor device 100 includes a semiconductor die 102 is mounted on a die pad 108 of a package leadframe 104. In this embodiment, the semiconductor die 102 is attached to the die pad 108 by way of a die attach material 120. The die attach material 120 may be a paste, film, or solder material, for example. The example semiconductor device 100 may be characterized as a leadframe based package (e.g., quad flat package, quad flat no-lead package). Simplified cross-sectional views of the example semiconductor device 100 taken along line A-A are shown in stages of manufacture depicted in FIG. 2 through FIG. 7.

The semiconductor die 102 has an active side (e.g., major side having circuitry, bond pads) and a backside (e.g., major side opposite of the active side). The semiconductor die 102 includes bond pads 116 and 118 located at the active side of the semiconductor die. The semiconductor die 102 may be formed from any suitable semiconductor material, such as silicon, germanium, gallium arsenide, gallium nitride, and the like. The semiconductor die 102 may further include any digital circuits, analog circuits, RF circuits, memory, processor, the like, and combinations thereof at the active side.

The leadframe 104 includes a plurality of leads 106, a die pad 108, and tie bars 110. The leads 106 have an outer end proximate to an outer perimeter 122 and an inner end proximate to the die pad 108. The leadframe 104 may be formed from any suitable metal materials, such as copper, nickel, aluminum, iron, or alloys thereof, for example. The leadframe 104 may be bare, partially plated, or plated with another metal or alloy. In this embodiment, conductive lead extenders 112 and 114 are affixed to particular neighboring pairs of leads of the plurality of leads 106 near the inner ends. The conductive lead extenders are affixed by way of a conductive adhesive and configured for extending the wire bonding area associated with the particular leads. The leads 106 and lead extenders 112 and 114 are configured for connection to the bond pads 116 and 118 of the semiconductor die 102 by way of bond wires, for example. The outer perimeter 122 depicts an anticipated outer perimeter location of a singulated package encapsulant at a subsequent stage of manufacture. Portions of the leadframe 104 outside of the outer perimeter 122 including dam bars interconnected to the plurality of leads 106 and the like are not shown for illustration purposes.

FIG. 2 through FIG. 7 illustrate, in simplified cross-sectional views, the example semiconductor device 100 taken along line A-A of FIG. 1 at stages of manufacture in accordance with an embodiment.

Figure 2:
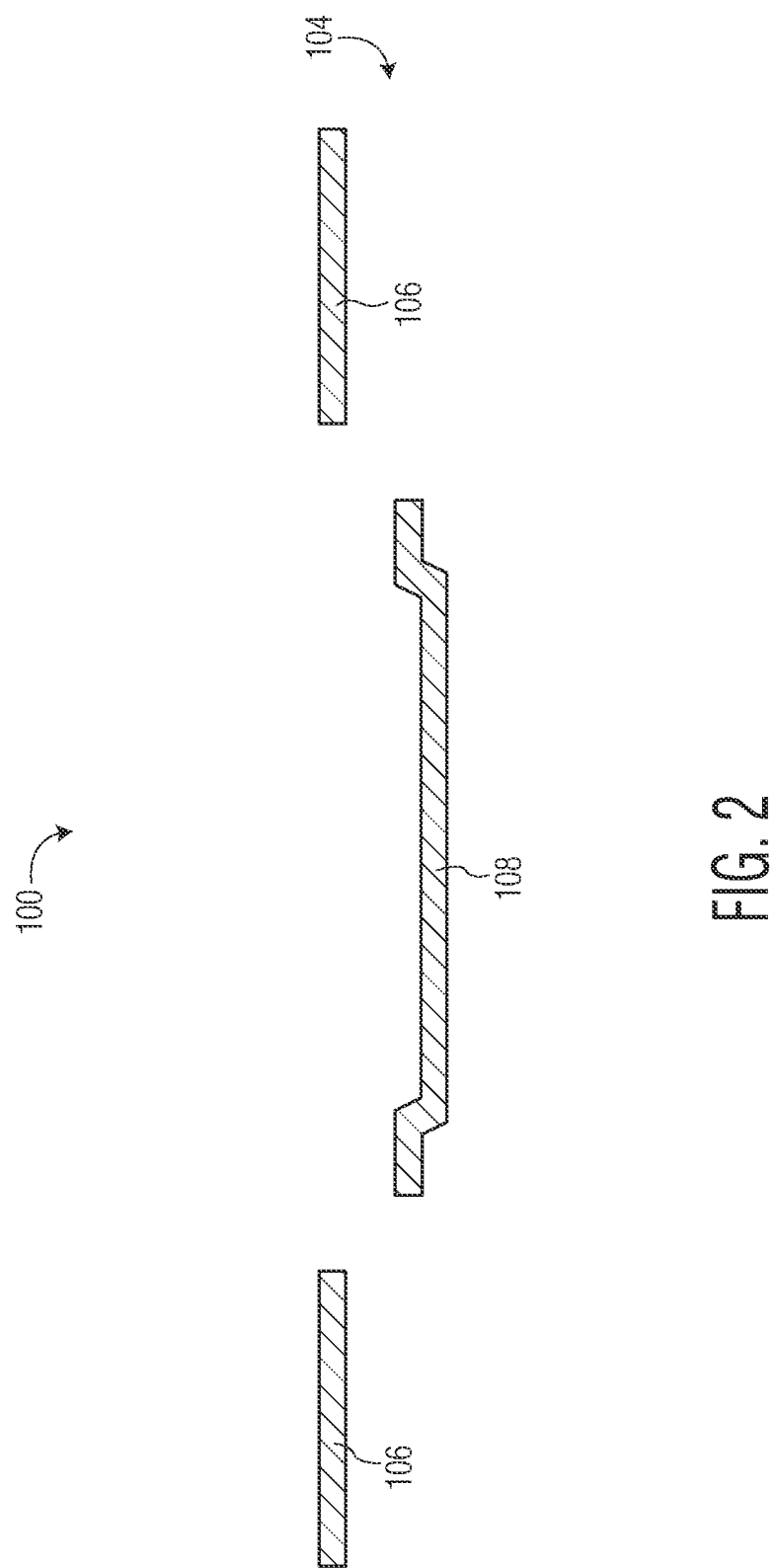
FIG. 2 through FIG. 7 illustrate, in simplified cross-sectional views, the example semiconductor device at stages of manufacture in accordance with an embodiment.

FIG. 2 illustrates, in a simplified cross-sectional view, the example semiconductor device 100 taken along line A-A at a stage of manufacture in accordance with an embodiment. At this stage, the semiconductor device 100 includes the leadframe 104 having leads 106 and die pad 108. In this embodiment, the die pad 108 is formed as a downset die pad having a recessed portion.

Figure 3:
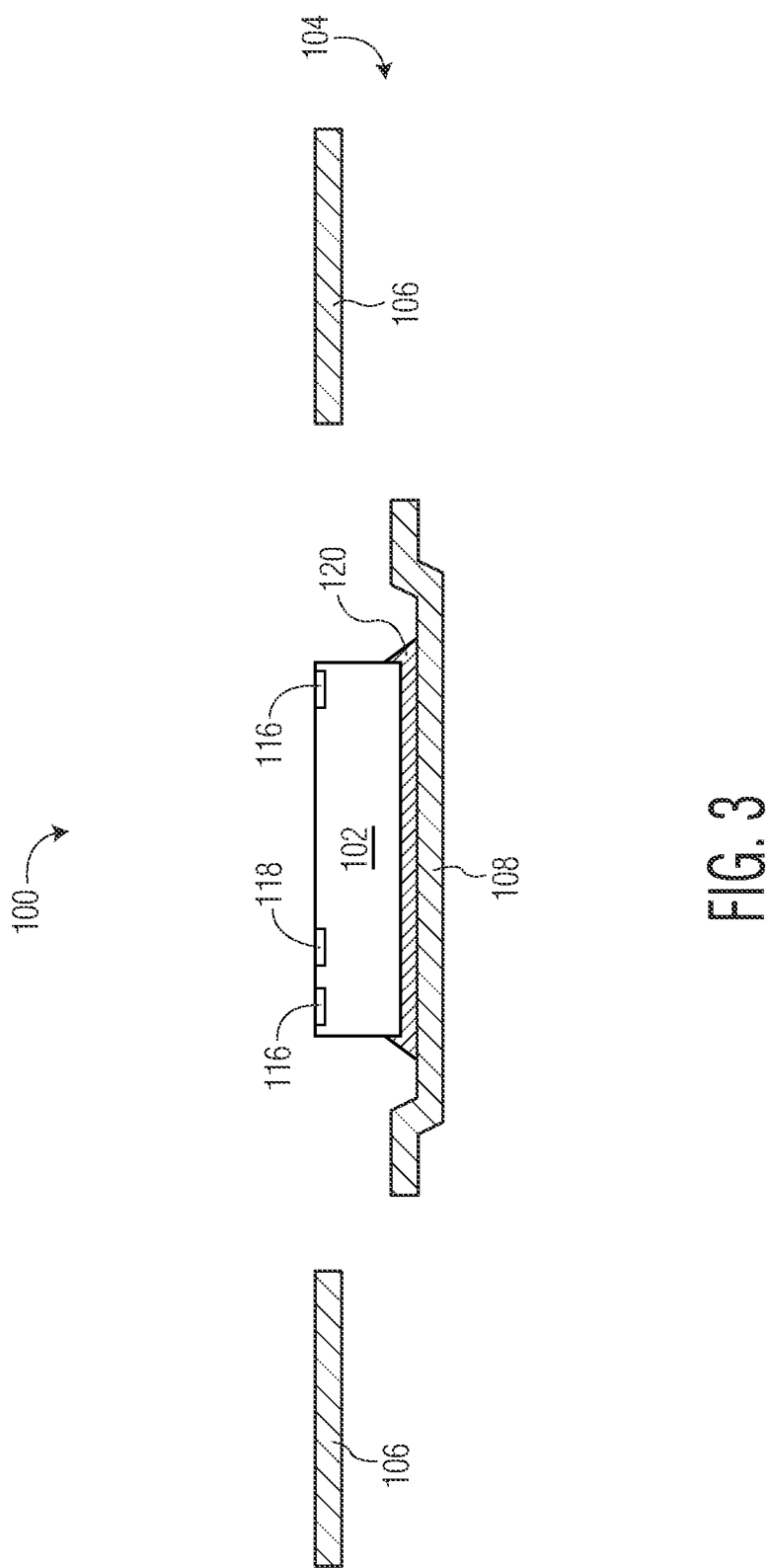

FIG. 3 illustrates, in a simplified cross-sectional view, the example semiconductor device 100 taken along line A-A at a subsequent stage of manufacture in accordance with an embodiment. At this stage, the semiconductor device 100 includes the semiconductor die 102 mounted on the die pad 108 of the lead frame 104. As depicted in the cross-sectional view of FIG. 3, the semiconductor die 102 is mounted on the die pad 108 in an active-side-up orientation. For example, the backside of the semiconductor die 102 is attached to top side of the die pad 108 by way of the die attach material 120. The die attach material 120 may be a paste, film (e.g., DAF), or other suitable die attach material. The semiconductor die 102 includes bond pads 116 located around a perimeter of the semiconductor and bond pad 118 located inboard of the bond pads 116 at the active side of the semiconductor die.

Figure 4:
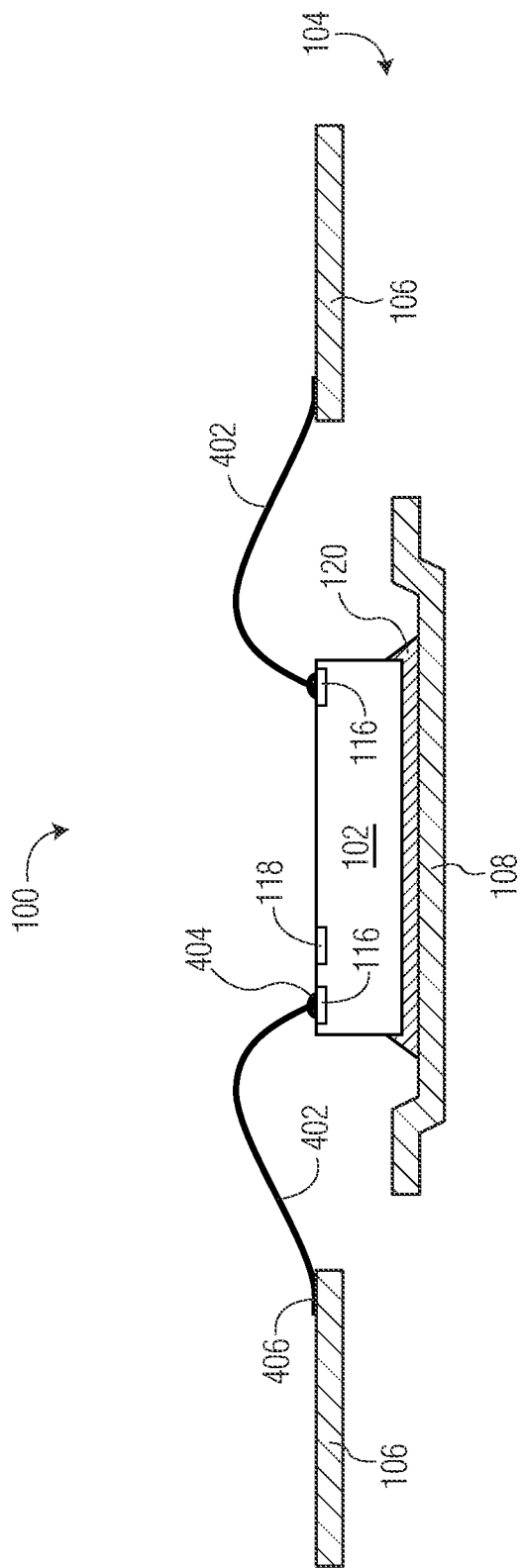

FIG. 4 illustrates, in a simplified cross-sectional view, the example semiconductor device 100 taken along line A-A at a subsequent stage of manufacture in accordance with an embodiment. At this stage, the semiconductor device 100 includes bond wires 402 interconnecting the semiconductor die 102 with conductive leads 106 of the lead frame 104. In this embodiment, a ball bond 404 is formed on the bond pad 116 with a first end of the bond wire 402 and a wedge bond 406 is formed on the conductive lead 106 with a second end of the bond wire 402. The bond wires 402 may be formed from a suitable metal material such as copper, silver, gold, or alloys thereof, for example.

Figure 5:
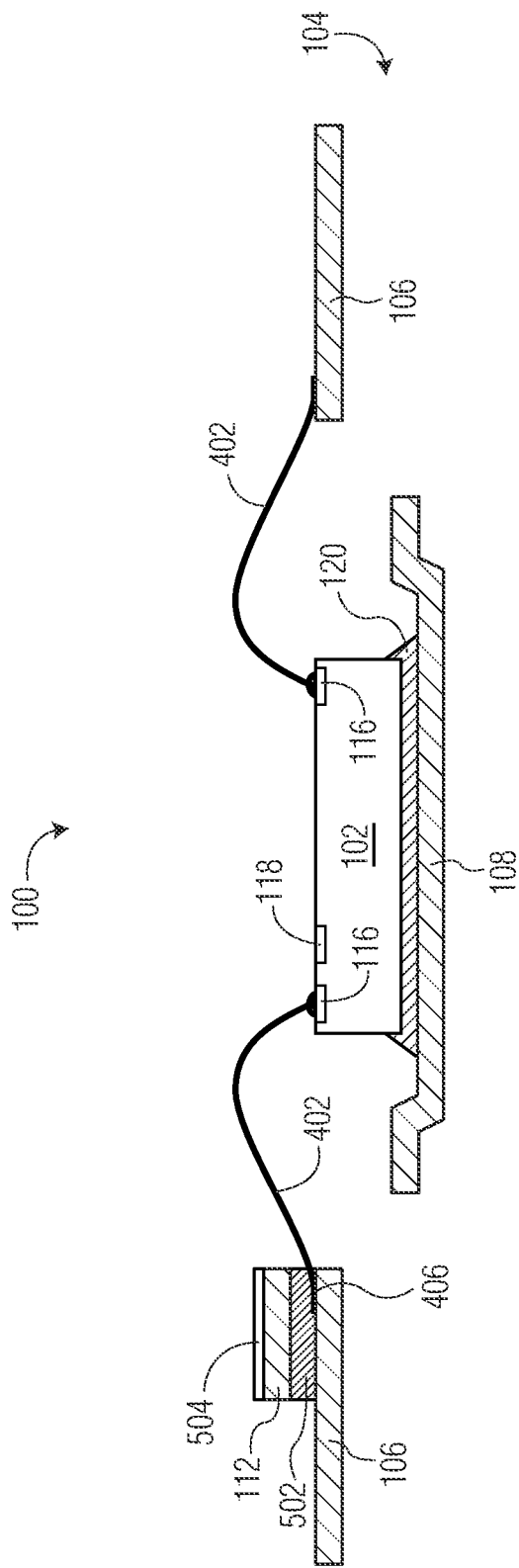

FIG. 5 illustrates, in a simplified cross-sectional view, the example semiconductor device 100 taken along line A-A at a subsequent stage of manufacture in accordance with an embodiment. At this stage, the conductive lead extender 112 is affixed to the conductive lead 106 by way of a conformal conductive adhesive 502. The conductive lead extender 112 overlaps the wedge bond 406 with the conformal conductive adhesive 502 directly contacting the wedge bond. The conductive lead extender 112 is configured for extending the wire bonding area of the conductive lead 106. Because the conductive lead extender is conductively attached over the wedge bond 406 and portion of the conductive lead 106, additional wire bonds may be formed on the conductive lead extender allowing for a plurality of wire bond connections to the conductive lead 106. The conductive lead extender 112 may be formed from a suitable metal material such as copper, for example. A top surface of the conductive lead extender 112 may be plated with a metal material 504 such as silver, nickel, or gold. In this embodiment, the conductive adhesive 502 is characterized as a conductive film-over-wire (FOW) film.

Figure 6:
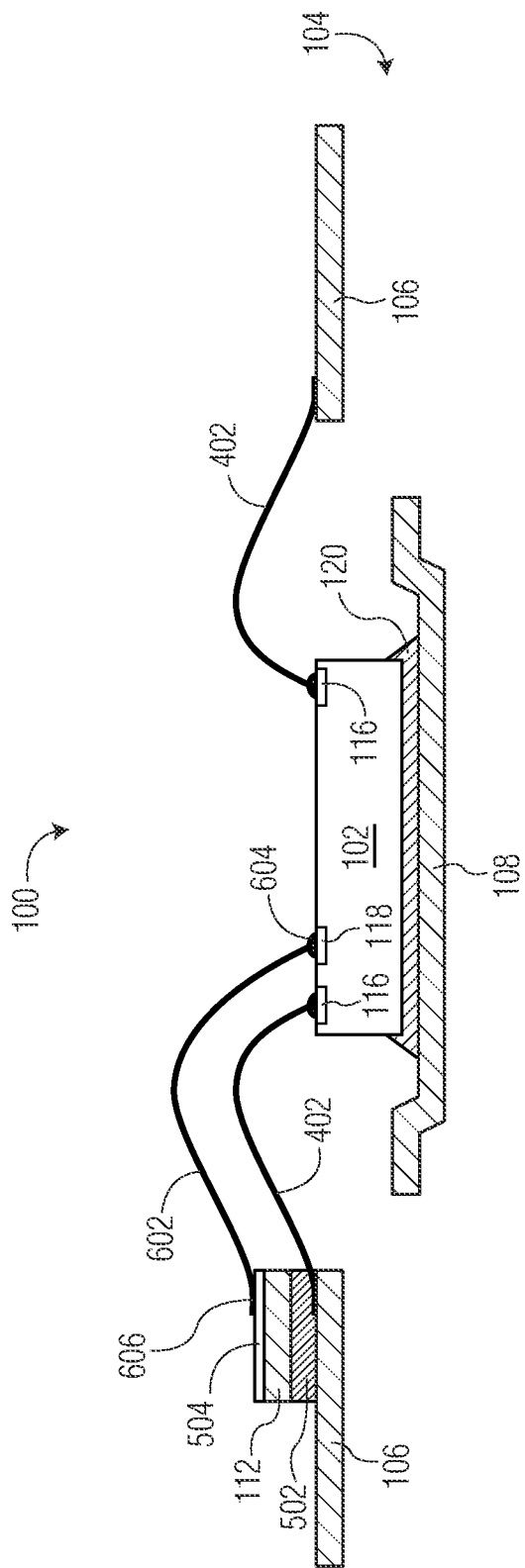

FIG. 6 illustrates, in a simplified cross-sectional view, the example semiconductor device 100 taken along line A-A at a subsequent stage of manufacture in accordance with an embodiment. At this stage, the semiconductor device 100 includes bond wire 602 interconnecting the semiconductor die 102 with conductive lead 106 by way of the conductive lead extender 112. In this embodiment, a ball bond 604 is formed on the bond pad 118 with a first end of the bond wire 602 and a wedge bond 606 is formed on the conductive lead extender 112 with a second end of the bond wire 602. The bond wire 602 may be formed from a suitable metal material such as copper, silver, gold, or alloys thereof, for example. The conductive lead extender 112 is conductively attached over the wedge bond 406 and a portion of the conductive lead 106 allowing for the wedge bond 606 of the bond wire 602 to formed over the wedge bond 406 of the bond wire 402, for example. In this manner, the bond wire 602 is conductively connected to the bond wire 402 by way of the conductive lead extender 112, thus extending the bonding area associated with the conductive lead 106. The bond wire 602 may be formed such that a portion of the bond wire 602 overlaps a portion of the bond wire 402 without touching, for example.

Figure 7:
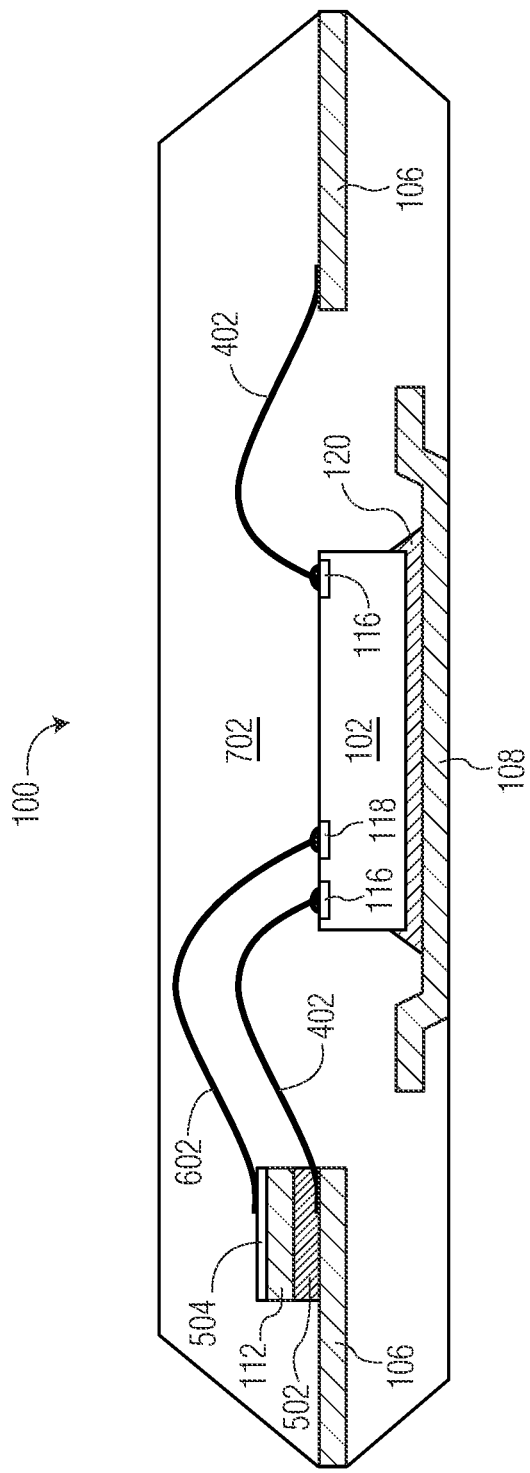

FIG. 7 illustrates, in a simplified cross-sectional view, the example semiconductor device 100 taken along line A-A at a subsequent stage of manufacture in accordance with an embodiment. At this stage, the semiconductor device 100 depicted in FIG. 7 includes an encapsulant 702 encapsulating the semiconductor die 102 and portions of the die pad 108 and leads 106. The encapsulant 702 may be an epoxy molding compound dispensed during an injection molding encapsulation operation, for example. Portions of the leads 106 outside of the encapsulated region of the semiconductor device 100 are not shown for illustration purposes. In this embodiment, the bottom surface of the die pad 108 may remain exposed after encapsulating with the encapsulant 702. For example, with the bottom surface of the die pad 108 exposed, connection to an external heatsink or printed circuit board (PCB) is facilitated. In some embodiments, the bottom surface of the die pad 108 may be encapsulated with the encapsulant 702. In a subsequent step, the semiconductor device 100 may be singulated into individual devices suitable for attachment to a printed circuit board, for example.

Figure 8:
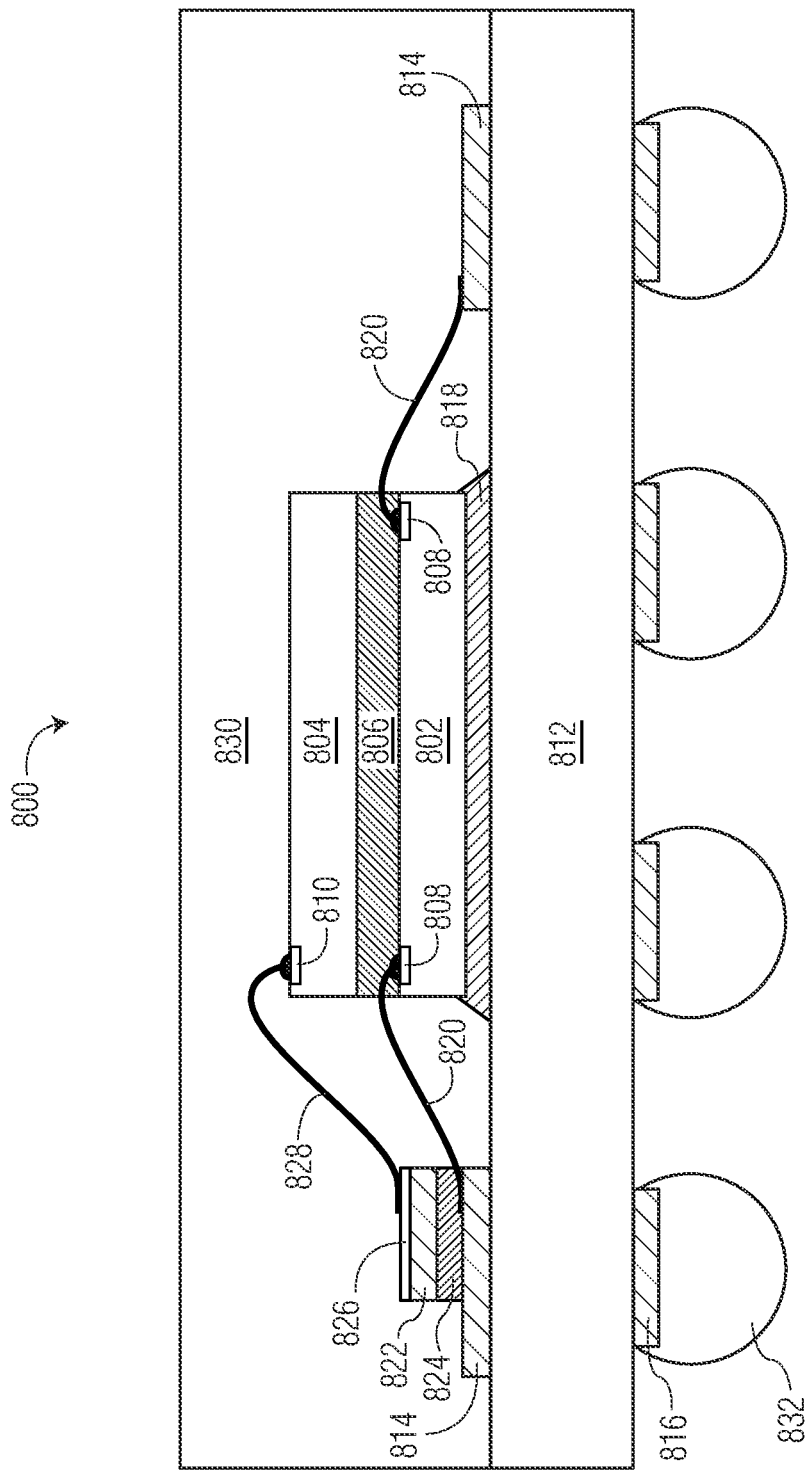
FIG. 8 illustrates, in a simplified cross-sectional view, an alternative example semiconductor device having a lead extender at a stage of manufacture in accordance with an embodiment.

FIG. 8 illustrates, in a simplified cross-sectional view, an alternative example semiconductor device 800 having a lead extender at a stage of manufacture in accordance with an embodiment. At this stage, the semiconductor device 800 is encapsulated with an encapsulant (e.g., epoxy material) 830 which encapsulates the stacked semiconductor die (802 and 804) and a top side portion of the package substrate 812. The example semiconductor device 800 may be characterized as a substrate based package (ball grid array package, chip scale package).

The package substrate 812 includes conductive features such as conductive leads (e.g., metal traces) 814 and conductive connector pads 816 separated by non-conductive material (e.g., FR-4). The package substrate further includes other conductive features (not shown) such as embedded vias and conductive traces configured to interconnect the semiconductor die 802 and 804 with a printed circuit board by way of the connector pads 816 and conductive connectors 832, for example.

In this embodiment, a first semiconductor die 802 is affixed at a top side of the package substrate 812 by way of a die attach material 818. The die attach material 818 may be a paste, film, or solder material, for example. Bond pads 808 of the semiconductor die 802 are conductively connected to conductive leads 814 by way of bond wires 820, for example. The bond wires 820 may be formed from a suitable metal material such as copper, silver, gold, or alloys thereof, for example. A second semiconductor die 804 is affixed to the first semiconductor die 802 by way of a non-conductive die attach (e.g., non-conductive film-over-wire) material 806. In this embodiment, the semiconductor die 802 and 804 are each arranged in an active-side-up orientation.

A conductive lead extender 822 is affixed to the conductive lead 814 by way of a conformal conductive adhesive (e.g., conductive film-over-wire) material 824. Bond pad 810 of the semiconductor die 804 is conductively connected to the conductive lead extender 822 by way of bond wire 828, for example. The bond wire 828 may be formed from a suitable metal material such as copper, silver, gold, or alloys thereof, for example. The conductive lead extender 822 is configured for extending the wire bonding area of the conductive lead 814. The conductive lead extender 822 may be formed from a suitable metal material such as copper, for example. A top surface of the conductive lead extender 822 may be plated with a metal material 826 such as silver, nickel, or gold.

Generally, there is provided, a method of manufacturing a packaged semiconductor device, the method including attaching a first end of a first bond wire to a first conductive lead and a second end of the first bond wire to a first bond pad of a first semiconductor die; affixing a conductive lead extender to the first conductive lead by way of a conductive adhesive, the conductive lead extender overlapping the first end of the first bond wire; and attaching a first end of a second bond wire to the lead extender, the first end of the second bond wire conductively connected to the first end of the first bond wire. The method may further include attaching a second end of the second bond wire to a second bond pad located on the first semiconductor die. The method may further include attaching a second end of the second bond wire to a second bond pad located on a second semiconductor die. The first conductive lead may be one of a plurality of conductive leads of a leadframe. The affixing the conductive lead extender may include affixing the conductive lead extender to a second conductive lead of the plurality of conductive leads, the second conductive lead a neighboring lead of the first conductive lead. The first conductive lead may be one of a plurality of conductive traces on a package substrate. The conductive lead extender may be formed from a copper material. A top surface of the conductive lead extender may be plated with a silver, nickel, or gold material. The conductive adhesive may be characterized as a conductive film-over-wire (FOW) film.

In another embodiment, there is provided, a method of manufacturing a packaged semiconductor device, the method including forming a first ball bond on a first bond pad of a first semiconductor die with a first end of a first bond wire; forming a first wedge bond on a first conductive lead with a second end of the first bond wire; affixing a conductive lead extender to the first conductive lead by way of a conductive adhesive, the lead extender overlapping the first wedge bond; and forming a second wedge bond on the lead extender with a first end of a second bond wire, the second bond wire conductively connected to the first bond wire by way of the conductive lead extender. The method may further include forming a second ball bond on a second bond pad located on the first semiconductor die with a second end of the second bond wire. The first conductive lead may be one of a plurality of conductive leads of a leadframe. The affixing the conductive lead extender may include affixing the conductive lead extender to a second conductive lead of the plurality of conductive leads, the second conductive lead neighboring the first conductive lead. The method may further include forming a second ball bond on a second bond pad located on a second semiconductor die with a second end of the second bond wire. The first conductive lead may be one of a plurality of conductive traces on a package substrate.

In yet another embodiment, there is provided, a semiconductor device including a plurality of conductive leads; a first semiconductor die including a first bond pad, the first bond pad conductively connected to a first conductive lead of the plurality of conductive leads by way of a first bond wire; a conductive lead extender affixed to the first conductive lead by way of a conductive adhesive, the lead extender overlapping a first end of the first bond wire; and a first end of a second bond wire attached to the lead extender, the second bond wire conductively connected to the first bond wire by way of the conductive lead extender. A second bond pad may be conductively connected to the conductive lead extender by way of the second bond wire, the second bond pad located on either the first semiconductor die or a second semiconductor die. The conductive lead extender may be further affixed to a second conductive lead of the plurality of conductive leads, the second conductive lead neighboring the first conductive lead. The conductive lead extender may be formed from a copper material. A top surface of the conductive lead extender may be plated with a silver, nickel, or gold material.

By now it should be appreciated that there has been provided, semiconductor device having a conductive lead extender. The semiconductor device includes one or more semiconductor die mounted on a package leadframe or substrate having a plurality of conductive leads. The lead extender is affixed to one or more (neighboring) leads of the plurality of leads. The conductive lead extender is affixed by way of a conductive adhesive and configured for extending the wire bonding area associated with the particular one or more leads without increasing package size or dimensions. The lead extender is especially useful on power leads requiring multiple connections to the one or more semiconductor die, for example.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method of manufacturing a packaged semiconductor device, the method comprising:
   attaching a first end of a first bond wire to a first conductive lead and a second end of the first bond wire to a first bond pad of a first semiconductor die;
   affixing a conductive lead extender to the first conductive lead by way of a conductive adhesive, the conductive lead extender directly overlapping the first end of the first bond wire such that the first end of the first bond wire is sandwiched between the conductive lead extender and the first conductive lead; and
   attaching a first end of a second bond wire to the lead extender, the first end of the second bond wire conductively connected to the first end of the first bond wire.

2. The method of claim 1, further comprising attaching a second end of the second bond wire to a second bond pad located on the first semiconductor die.

3. The method of claim 2, wherein affixing the conductive lead extender includes affixing the conductive lead extender to a second conductive lead of the plurality of conductive leads, the second conductive lead a neighboring lead of the first conductive lead.

4. The method of claim 1, further comprising attaching a second end of the second bond wire to a second bond pad located on a second semiconductor die.

5. The method of claim 1, wherein the first conductive lead is one of a plurality of conductive leads of a leadframe.

6. The method of claim 1, wherein the first conductive lead is one of a plurality of conductive traces on a package substrate.

7. The method of claim 1, wherein the conductive lead extender is formed from a copper material.

8. The method of claim 1, wherein a top surface of the conductive lead extender is plated with a silver, nickel, or gold material.

9. The method of claim 1, wherein the conductive adhesive is characterized as a conductive film-over-wire (FOW) film.

10. A method of manufacturing a packaged semiconductor device, the method comprising:
forming a first ball bond on a first bond pad of a first semiconductor die with a first end of a first bond wire;
forming a first wedge bond on a first conductive lead with a second end of the first bond wire;
affixing a conductive lead extender to the first conductive lead by way of a conductive adhesive, the lead extender directly overlapping the first wedge bond such that the first wedge bond is disposed between the conductive lead extender and the first conductive lead; and
forming a second wedge bond on the lead extender with a first end of a second bond wire, the second bond wire conductively connected to the first bond wire by way of the conductive lead extender.

11. The method of claim 10, further comprising forming a second ball bond on a second bond pad located on the first semiconductor die with a second end of the second bond wire.

12. The method of claim 10, wherein the first conductive lead is one of a plurality of conductive leads of a leadframe.

13. The method of claim 12, wherein affixing the conductive lead extender includes affixing the conductive lead extender to a second conductive lead of the plurality of conductive leads, the second conductive lead neighboring the first conductive lead.

14. The method of claim 10, further comprising forming a second ball bond on a second bond pad located on a second semiconductor die with a second end of the second bond wire.

15. The method of claim 10, wherein the first conductive lead is one of a plurality of conductive traces on a package substrate.

\* \* \* \* \*